United States Patent
Bock et al.

[11] Patent Number: 6,135,825
[45] Date of Patent: Oct. 24, 2000

[54] CONNECTOR FOR DETACHABLE FASTENING TO A RAIL

[75] Inventors: Werner Bock, Gross-Umstadt; Franz Müller, Griesheim, both of Germany

[73] Assignee: The Whitaker Corporation, Wilmington, Del.

[21] Appl. No.: 09/100,422

[22] Filed: Jun. 22, 1998

[30] Foreign Application Priority Data

Jun. 27, 1997 [DE] Germany .......................... 197 27 454

[51] Int. Cl.⁷ .................................................. H01R 9/26
[52] U.S. Cl. ............................................................ 439/716
[58] Field of Search .................................. 439/352, 357, 439/358, 716, 717, 266

[56] References Cited

U.S. PATENT DOCUMENTS

| | | | |
|---|---|---|---|
| 4,941,849 | 7/1990 | Fujiura | 439/357 |
| 5,356,309 | 10/1994 | Carney et al. | 439/716 |
| 5,388,999 | 2/1995 | Nozick | 439/716 |
| 5,658,172 | 8/1997 | Schmidt et al. | 439/716 |
| 5,713,752 | 2/1998 | Leong et al. | 439/358 |

FOREIGN PATENT DOCUMENTS

| | | | |
|---|---|---|---|
| 2432258 | 3/1980 | France | 439/717 |
| 660 24 30 U | 5/1969 | Germany . | |
| 80 20 041 U | 10/1980 | Germany | H02B 1/10 |
| 29 28118 C2 | 10/1981 | Germany | H02B 1/04 |
| 3345803 | 7/1985 | Germany | 439/717 |
| 891 19 935 U1 | 3/1990 | Germany | H05K 5/00 |
| 39 22 551 C2 | 2/1991 | Germany | H05K 5/00 |
| 42 10 556 A1 | 10/1993 | Germany | H02B 1/052 |
| 931 65 188 U | 2/1994 | Germany | H02B 1/052 |
| 43 39 785 A1 | 5/1995 | Germany | H01R 9/26 |
| 44 12 135 C1 | 6/1995 | Germany | H05K 5/02 |
| 295 06 579 U1 | 8/1995 | Germany | H02B 1/052 |
| 19548335 C1 | 12/1996 | Germany | H02B 1/052 |
| 297 04 237 U1 | 7/1997 | Germany | H05K 5/00 |
| 1 553 460 | 9/1979 | United Kingdom | H05K 5/00 |

OTHER PUBLICATIONS

Copy of German Search Report.

*Primary Examiner*—Paula Bradley
*Assistant Examiner*—Briggitte R. Hammond
*Attorney, Agent, or Firm*—Michael Aronoff

[57] ABSTRACT

A connector for detachable fastening to a rail comprises at least one modular electric or electronic housing having at least one movable latching means and at least one lever arm for detachable fastening of the housing to the rail, where the latching means can be moved from a first locking position to a second unlocking position by a lever movement of a lever arm, and where the latching means has a spring with a free end which engages with a holding region of the housing in such a way that the latching means moves back from the second unlocking position into the first locking position upon release of the lever arm, and the lever arm has an abutment which cooperates with a side wall of the housing and is arranged at about half the distance between a joint for connecting to the latching means and an actuating region for actuating the lever arm.

6 Claims, 3 Drawing Sheets

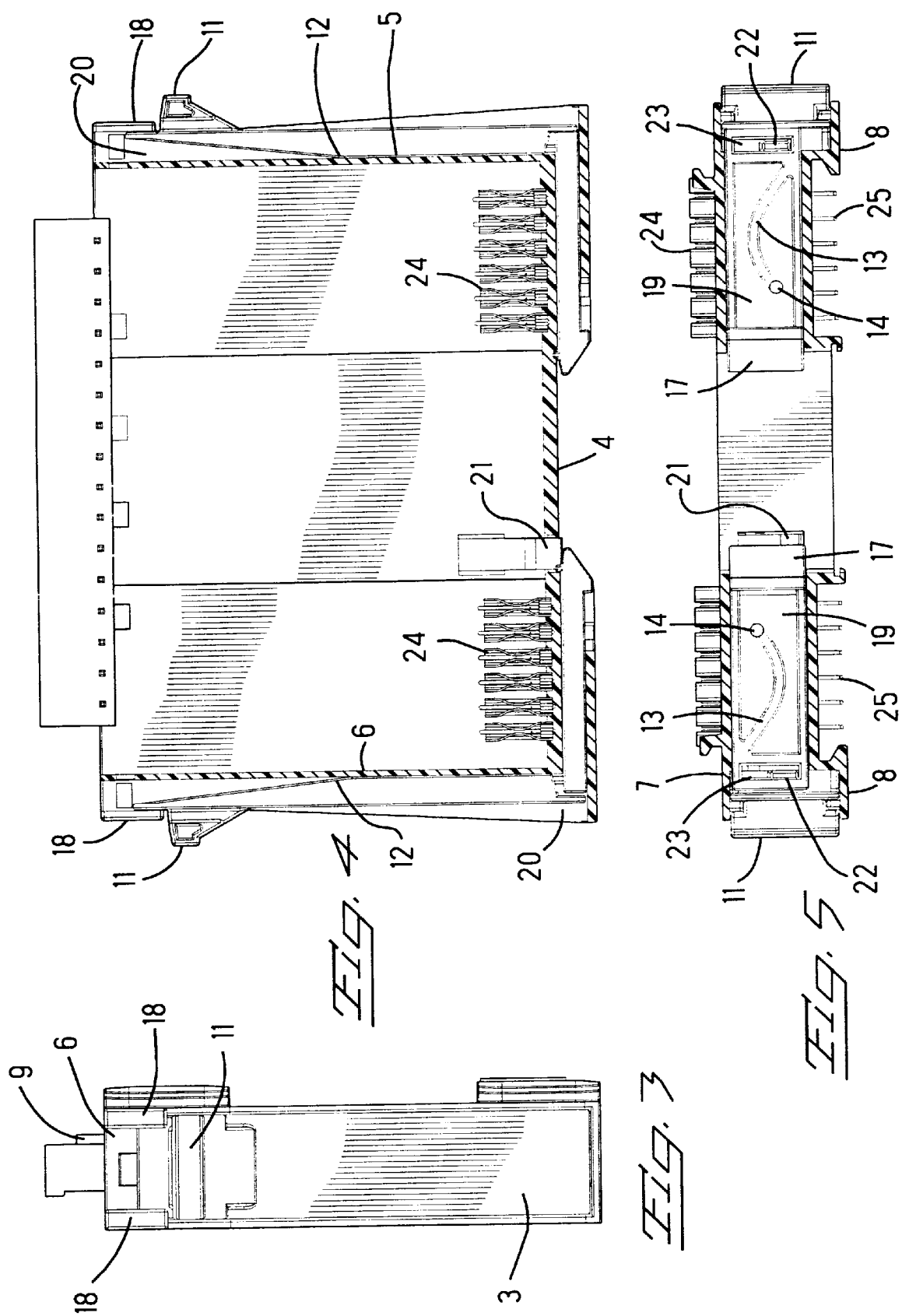

CONNECTOR FOR DETACHABLE FASTENING TO A RAIL

BACKGROUND OF THE INVENTION

1. Field of the Invention

The invention relates to connectors for detachable fastening to a rail. At least one housing having at least one movable latching means for detachable fastening of the housing to the rail, the latching means cooperates with a lever arm in such a way that the latching means can be moved from a first locking position to a second unlocking position by a lever movement of the lever arm.

2. Description of the Prior Art

A connector apparatus for detachable fastening to a rail is disclosed in DE 43 39 785-A1. Two different flexible plastic latching feet are arranged on a floor of a plastic housing. The two latching feet are unlatched in opposite directions by means of a lever tool so that the housing can be removed vertically upwards from the rail. The first latching foot is moved to unlatch in one direction by the lever tool by means of a pushing element. The second latching foot is connected by means of a movable floor element to an insertion pocket that receives the tip of the lever tool, and is moved to unlatch in the opposite direction. The head of the pushing element forms the abutment for the lever movement. The abutment is situated in the region of the housing floor, and the actuating path which the actuating region on the other end of the lever tool must cover for unlatching purposes is correspondingly large.

SUMMARY OF THE INVENTION

It is an object of the invention to specify a connector for detachable fastening to a rail which can be inserted in conditions of restricted space. This object is achieved by means of the following features: housing that has at least one movable latching means for detachable fastening of the housing to the rail, the latching means cooperates with a lever arm in such a way that the latching means can be moved from a first locking position to a second unlocking position by a lever movement of a lever arm, connected to the latching means is a spring which has a free end which engages with a holding region of the housing in such a way that the latching means moves back from the second unlocking position into the first locking position upon release of the lever arm.

This object is also achieved by means of an arrangement for detachable fastening to a rail, having the following features: at least one housing is provided, which has at least one movable latching means for detachable fastening of the housing to the rail, the latching means cooperates with a lever arm in such a way that the latching means can be moved from a first locking position to a second unlocking position by a lever movement of the lever arm, the lever arm has an abutment, which cooperates with a side wall of the housing, at approximately half the distance between a joint for connecting to the latching means and an actuating region for actuating the lever arm.

It is advantageous that the arrangement for fastening to a rail can be produced as simply as possible. This is achieved having as one piece the latching means and spring which has a free end which engages with a holding region of the housing in such a way that the latching means moves back from the second unlocking position into the first locking position upon release of the lever arm as a result of the spring resilience. When the latching means forms a part with a spring, resilient regions can be dispensed with on the housing.

It is also advantageous that the housing can easily be inserted in restricted lateral space conditions. This is achieved as the lever arm has an abutment, which cooperates with a side wall of the housing, at approximately half the distance between a joint for fastening to the latching means and an actuating region for actuating the lever arm. The lever movement of the lever arm from a first locking position into a second unlocking position requires less space if the abutment is arranged at approximately half the distance between the joint and the actuating region.

It is further advantageous that the connector for detachable fastening to a rail can be produced with the smallest possible number of injection-moulded parts. This advantage is achieved as the latching means and the holding region of the housing are constructed in a complementary fashion in such a way that identical latching means and identical lever arms can be inserted on two mutually opposite flanges of the rail.

It is advantageous, furthermore, that the connector for detachable fastening to a rail can be built up in a modular fashion. This is achieved as the latching means is arranged on a rear wall of the housing, adjacent to the rail, and in that the lever arm is arranged on the side wall of the housing leading away from the rail, in such a way that a multiplicity of housings with top sides which have bus contacts, and undersides, which have complementary bus contacts, can be connected to each other to form a modular bus system and can be latched together on the rail.

It is advantageous, furthermore, that the arrangement for detachable fastening to a rail simultaneously ensures a good connection to earth. This is achieved by including an earthing clip that is arranged on the housing adjacent to the rail in such a way that in the locking position the earthing clip is connected to the rail by the latching means.

BRIEF DESCRIPTION OF THE DRAWINGS

FIG. 3 shows a view of a side wall of the arrangement of FIG. 2;

FIG. 4 shows a sectional view through the arrangement of FIG. 2 perpendicular to the direction of the rail; and FIG. 5 shows a sectional view through the arrangement of FIG. 2 parallel to the rail.

DETAILED DESCRIPTION OF THE PREFERRED EMBODIMENT

Figure 1:
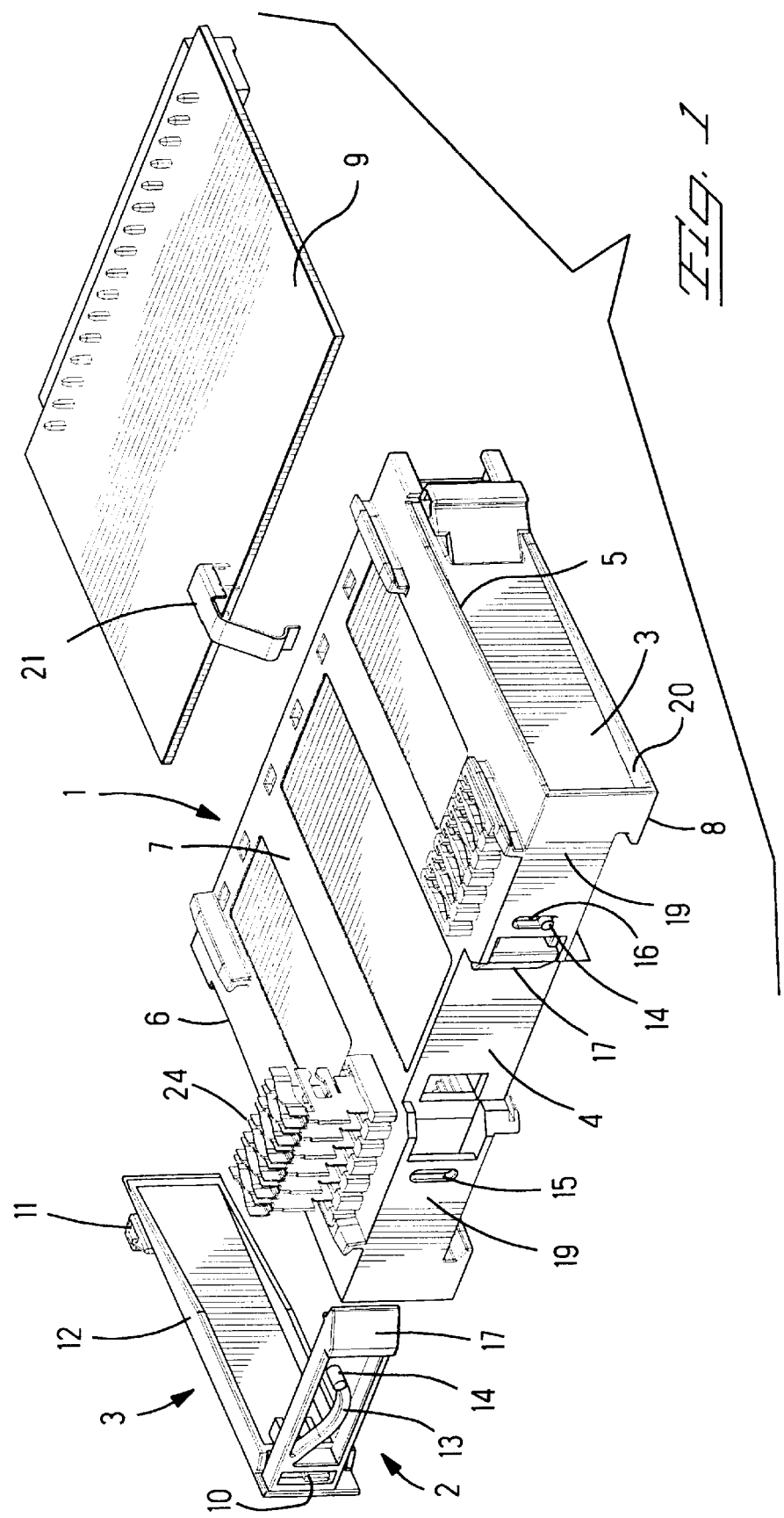
FIG. 1 shows a perspective partially exploded representation of a connector according to the present invention for detachable fastening to a rail.

A connector for detachable fastening to a rail is represented in FIG. 1, but without the rail itself. A rail of this type is shown in DE 43 39 785A1. The connector comprises a modular electric or electronic housing 1, at least one latching means 2 and at least one lever arm 3. The housing 1 has a rear wall 4, two side walls 5, 6, a top side 7 and an underside 8. Electronic or electric components, which are arranged on a printed circuit board 9 and disposed in the housing 1. The rail to which the housing 1 is to be fastened, runs adjacent the rear wall 4 in a direction perpendicular to the printed circuit board 9. Provided on the rear wall 4 of the housing 1 are receptacles 19, into which the latching means 2 can be introduced laterally relative to the rear wall 4. Further receptacles 20, into which the lever arm 3 can be introduced laterally relative to the side wall 5, 6, are provided on the side walls 5, 6.

The latching means 2 and the lever arm 3 are loose parts which are introduced sequentially into the receptacles 19 or into the receptacles 20 and are interconnected via a joint 10. The lever arm 3 has an abutment 12 at approximately half the distance between the joint 10 and an actuating region 11. The abutment 12 cooperates with the side wall 5, 6 of the housing 1. Because the latching means 2 and the lever arm 3 are constructed as loose parts, the same parts can also be used with other housings which fit other rails.

A spring 13 with a free end 14 is formed in one piece to the latching means 2. The free end 14 of the spring 13 is constructed as a pin which engages with a holding region 15, 16 of the housing 1. The latching means 2 is arranged such that it can be moved by a lever movement of the lever arm 3 from a first locking position into a second unlocking position. Because the free end 14 of the spring 13 engages with the holding region 15, 16 of the housing 1, a spring force is built up during the movement from the first locking position into the second unlocking position. This spring force ensures that the latching means 2 moves back again from the second unlocking position into the first locking position upon release of the lever arm 3. The latching means 2 and the holding region 15, 16 of the housing 1 are constructed in a complementary fashion in such a way that identical latching means 2 and identical lever arms 3 can be inserted at two mutually opposite flanges of the rail. Because the holding regions 15, 16 are designed as slots, the same latching means 2 can be latched on both sides of the rail with the pins of the free end 14.

The latching means 2 executes a rectilinear movement parallel to the rear wall 4 of the housing 1 into receptacle 19 from the locking position to the unlocking position. The spring 13 is tensioned in the unlocking position. The latching means 2 releases the outer flange of the rail in the unlocking position. The latching means 2 has a wedge-shaped end 17 which in the unlocking position clamps an outer flange of the rail between the latching means 2 and the rear wall 4.

Figure 2:
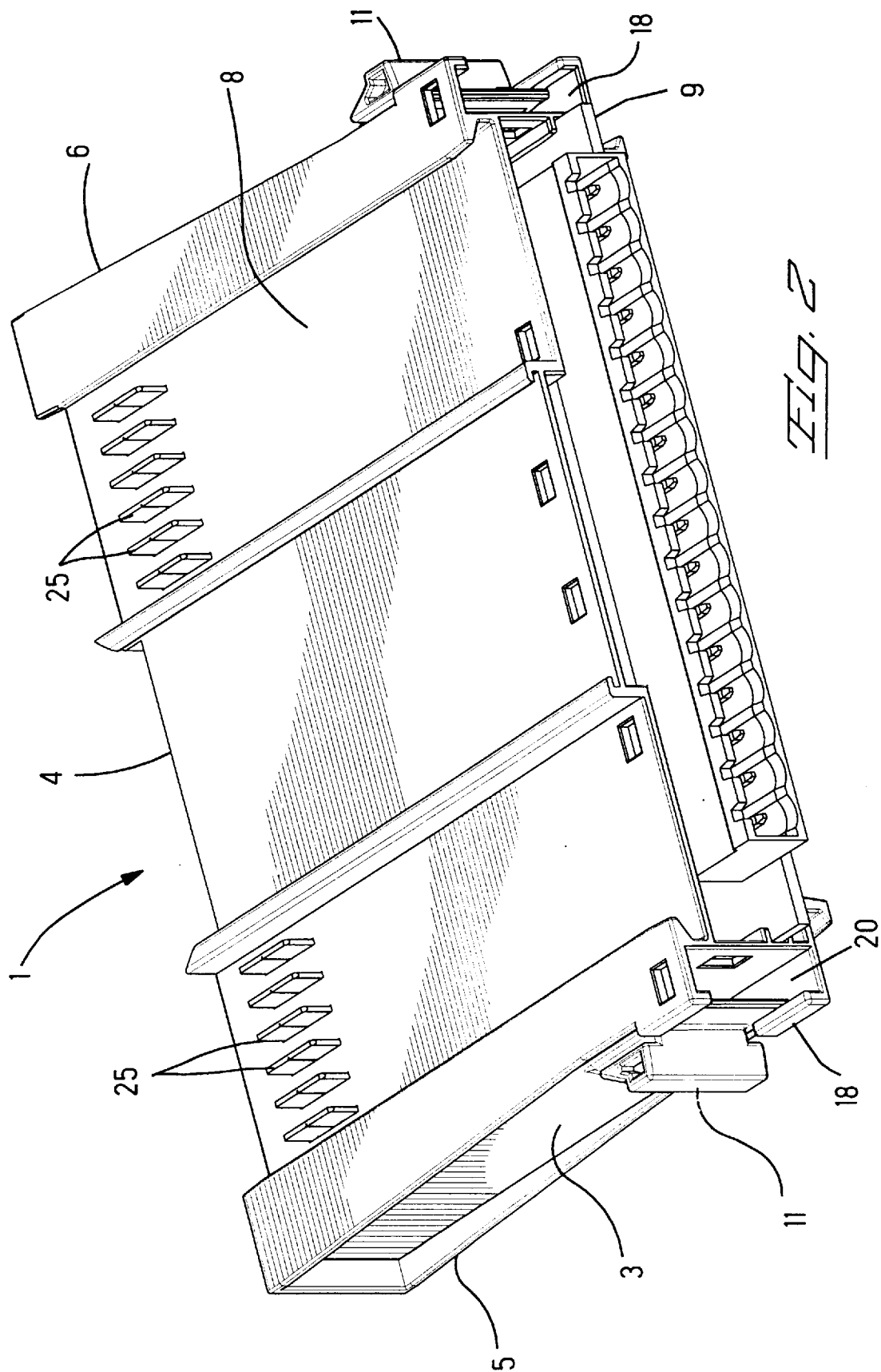
FIG. 2 shows a perspective representation of the assembled arrangement of FIG. 1.

In FIG. 2, the housing 1 of FIG. 1 is represented in the assembled state, looking onto the underside 8. The printed circuit board 9 is inserted into the housing 1. The lever arms 3 are arranged in further receptacles 20 on the side walls 5, 6. The arrangement of the lever arm 3 in the receptacle 20 on the side wall 6 is represented in FIG. 2, and more effectively in FIG. 3. The side wall 6 has capture rails 18 which serve to hold the actuating region 11 of the lever arm 3. The capture rails 18 facilitate the assembly of the lever arm 3 with the housing 1 and prevent excessive lever movement of the lever arm 3 away from the housing 1.

The action of the latching means 2 and of the lever arm 3 can be explained with the aid of the sections of FIG. 4 and FIG. 5. The housing 1 is represented in section between the top side 7 and underside 8 in FIG. 4. In FIG. 5, the section was made perpendicular to the section of FIG. 4 parallel to the rear wall 4 through the receptacle 19 and through the latching means 2. The two latching means 2 are represented in FIGS. 4 and 5 in the locking position, that is to say in the untensioned state of the spring 13. The wedge-shaped end 17 in each case clamps an outer flange of a so-called top-hat rail to the rear wall 4 of the housing 1.

It is also to be seen in FIG. 4 how an earthing clip 21 is arranged on the housing 1 to be adjacent to the rail in such a way that in the locking position the earthing clip 21 is connected to the rail by the latching means 2. The lever arm 3 bears against the side wall 5, 6. The actuating region 11 is held by the capture rails 18. The abutment 12 of the lever arm 3 is arranged at approximately half the distance between the actuating region 11 and the joint 10. As a result of this, the joint 10 covers a path of the same length as the actuating region 11 during actuation of the lever arm 3. As a result of this, the actuating region 11 need not traverse any substantially longer path than is required for the movement of the latching means 2 from the unlocking position into the locking position, or vice versa.

It is to be seen in FIG. 5 how the latching means 2 can be inserted on two mutually opposite flanges of the rail. Again, the lever arm 3 is designed with mirror symmetry and has a nose 22 which is symmetrical relative to the centre line and forms the joint 10 together with a slot-shaped cutout 23 in the latching means 2. The latching means 2 is arranged capable of moving rectilinearly in the direction of the flanges of the rail, and the housing 1 is arranged perpendicular to the rail such that it can be latched and detached. The result of this is that the housing 1 is arranged capable of moving perpendicular to the housing 1. Because it is the case that parts are arranged for latching purposes only on the rear wall 4 and on the side walls 5, 6, the top side 7 and the underside 8 can be used for other functions independently of latching. For example, the top side 7 has bus contacts 24, and the underside 8 has complementary bus contacts 25. A multiplicity of housings 1 with top sides 7 and undersides 8 having bus contacts 24, 25 can be interconnected to form a modular bus system, and can be latched onto the rail individually or together, and detached again.

We claim:

1. A connector that can be detachably fastened to a rail; comprising:
    a connector housing having
    a side wall;
    a rear wall transverse to the side wall and having a latch receptacle extending inwardly therealong to define a latch receiving passageway, the rear wall further including a holding region in the vicinity of the latch receptacle; and,
    a latch for detachably fastening the connector to the rail with the rear wall facing the rail, where the latch includes
        a lever arm disposed along the side wall that has a depressible actuating region remote from the rear wall, a joint region disposed in the vicinity of the rear wall and an abutment that cooperates with the housing for effecting pivoting of the lever arm thereabout;
        a latching means disposed along the rear wall in the latch receiving passageway and having a joint end, disposed towards the side wall, that is connected to the joint region of the lever arm, a latch head opposite the joint end and remote from the side wall along the rear wall, and a spring member connected to the holding region for biasing the latching means;
    whereby depression of the actuating region causes the lever arm to pivot about the abutment, thereby displacing the latching means along the rear wall against the spring member.

2. The connector of claim 1, wherein the connector housing includes a second side wall generally opposite the side wall;
    the rear wall extends transversely between the two side walls and includes a second latch receptacle extending inwardly therealong from the second side wall to define a second latch receiving passageway, the rear wall further including a second holding region in the vicinity of the second latch receptacle; and, a second latch for detachably fastening the connector to the rail with the rear wall facing the rail, where the second latch includes a second lever arm disposed along the second side wall that has a depressible second actuating region remote from the rear wall, a second joint region disposed in the vicinity of the rear wall and a second abutment that cooperates with the housing for effecting pivoting of the second lever arm thereabout;

a second latching means disposed along the rear wall in the second latch receiving passageway and having a second joint end, disposed towards the second side wall, that is connected to the second joint region, a second latch head opposite the second joint end and remote from the second side wall along the rear wall, and a second spring member connected to the second holding region for biasing the second latching means;

whereby depression of the second actuating region causes the second lever arm to pivot about the second abutment, thereby displacing the second latching means along the rear wall against the second spring member.

3. The connector of claim 2, where the latch arm and the latching means are separate components and the second latch arm and the second latching means are separate components.

4. The connector of claim 2, where the latch and the second latch are formed of identical components.

5. The connector of claim 2, wherein the spring member and the second spring member are unitary with their respective latching means.

6. The connector of claim 5, wherein the spring member and the second spring member extend to a free end having a pin, the holding region being formed as a slot and the pin being disposed in the slot.

* * * * *